(12) United States Patent
Sun et al.

(10) Patent No.: US 10,566,568 B2
(45) Date of Patent: Feb. 18, 2020

(54) ORGANIC LIGHT EMITTING DIODE DISPLAY SUBSTRATE, ORGANIC LIGHT EMITTING DIODE DISPLAY APPARATUS, AND METHOD OF FABRICATING ORGANIC LIGHT EMITTING DIODE DISPLAY SUBSTRATE

(71) Applicant: BOE Technology Group Co., Ltd., Beijing (CN)

(72) Inventors: Hongda Sun, Beijing (CN); Youngsuk Song, Beijing (CN); Jiangbo Chen, Beijing (CN); Wei Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/080,962

(22) PCT Filed: Aug. 29, 2017

(86) PCT No.: PCT/CN2017/099479
§ 371 (c)(1),
(2) Date: Aug. 29, 2018

(87) PCT Pub. No.: WO2019/041128
PCT Pub. Date: Mar. 7, 2019

(65) Prior Publication Data
US 2019/0173047 A1    Jun. 6, 2019

(51) Int. Cl.
*H01L 51/52* (2006.01)
*H01L 27/32* (2006.01)
*H01L 51/56* (2006.01)

(52) U.S. Cl.
CPC ........ *H01L 51/5228* (2013.01); *H01L 27/322* (2013.01); *H01L 27/329* (2013.01);
(Continued)

(58) Field of Classification Search
CPC ........................... H01L 51/50; H01L 51/5234
See application file for complete search history.

(56) References Cited

U.S. PATENT DOCUMENTS

| 9,978,994 B2 * | 5/2018 | Shen .................... H01L 51/5228 |
| 2005/0209392 A1 * | 9/2005 | Luo ........................ B82Y 30/00 524/496 |

(Continued)

FOREIGN PATENT DOCUMENTS

| CN | 101202299 A | 6/2008 |
| CN | 202917543 U | 5/2013 |

(Continued)

OTHER PUBLICATIONS

International Search Report & Written Opinion dated May 30, 2018, regarding PCT/CN2017/099479.

*Primary Examiner* — Nicholas J Tobergte
(74) *Attorney, Agent, or Firm* — Intellectual Valley Law, P.C.

(57) ABSTRACT

The present application discloses an organic light emitting diode display substrate. The organic light emitting diode display substrate includes a base substrate; an auxiliary cathode on the base substrate; a spacer layer on the base substrate and including a plurality of spacers; and a flexible transparent conductive layer on a side of each of the plurality of spacers distal to the base substrate. The flexible transparent conductive layer is electrically connected to the auxiliary cathode.

18 Claims, 8 Drawing Sheets

(52) U.S. Cl.
CPC ...... *H01L 27/3211* (2013.01); *H01L 27/3251* (2013.01); *H01L 51/5234* (2013.01); *H01L 51/56* (2013.01); *H01L 51/525* (2013.01); *H01L 51/5284* (2013.01); *H01L 2227/323* (2013.01)

(56) References Cited

U.S. PATENT DOCUMENTS

| | | | |
|---|---|---|---|
| 2007/0246689 A1* | 10/2007 | Ge | B82Y 10/00 |
| | | | 252/500 |
| 2008/0143255 A1 | 6/2008 | Lee et al. | |
| 2010/0097295 A1* | 4/2010 | Kwak | H01L 27/322 |
| | | | 345/32 |
| 2010/0110048 A1* | 5/2010 | Min | H01L 27/3253 |
| | | | 345/204 |
| 2011/0042697 A1 | 2/2011 | Lee et al. | |
| 2013/0341074 A1* | 12/2013 | Virkar | B82Y 30/00 |
| | | | 174/255 |
| 2014/0183501 A1 | 7/2014 | Kim et al. | |
| 2016/0181566 A1 | 6/2016 | Wang | |
| 2016/0233458 A1 | 8/2016 | Shen et al. | |
| 2017/0271370 A1* | 9/2017 | Wang | G02F 1/133345 |
| 2018/0254430 A1* | 9/2018 | Zhao | H01L 51/5228 |
| 2019/0088728 A1* | 3/2019 | Wu | H01L 27/3246 |

FOREIGN PATENT DOCUMENTS

| | | |
|---|---|---|
| CN | 103715231 A | 4/2014 |
| CN | 103972270 A | 8/2014 |
| CN | 104078491 A | 10/2014 |
| CN | 104112767 A | 10/2014 |
| CN | 104885252 A | 9/2015 |
| CN | 205092271 U | 3/2016 |

\* cited by examiner

ORGANIC LIGHT EMITTING DIODE DISPLAY SUBSTRATE, ORGANIC LIGHT EMITTING DIODE DISPLAY APPARATUS, AND METHOD OF FABRICATING ORGANIC LIGHT EMITTING DIODE DISPLAY SUBSTRATE

CROSS-REFERENCE TO RELATED APPLICATION

This application is a national stage application under 35 U.S.C. § 371 of International Application No. PCT/CN2017/099479, filed Aug. 29, 2017, the contents of which are incorporated by reference in the entirety.

TECHNICAL FIELD

The present invention relates to display technology, more particularly, to an organic light emitting diode display substrate, an organic light emitting diode display apparatus, and a method of fabricating an organic light emitting diode display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD. An OLED display apparatus typically includes an anode, an organic layer including a light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present invention provides an organic light emitting diode display substrate, comprising a base substrate; an auxiliary cathode on the base substrate; a spacer layer on the base substrate and comprising a plurality of spacers; and a flexible transparent conductive layer on a side of each of the plurality of spacers distal to the base substrate; wherein the flexible transparent conductive layer is electrically connected to the auxiliary cathode.

Optionally, the flexible transparent conductive layer comprises a polymer material.

Optionally, the polymer material comprises a conductive polymer.

Optionally, the flexible transparent conductive layer further comprises a metal.

Optionally, a projection of the flexible transparent conductive layer on the base substrate substantially covers projections of the plurality of spacers on the base substrate.

Optionally, each of the plurality of spacers protrudes away from the base substrate; and an end of each of the plurality of spacers distal to the base substrate has a curved surface.

Optionally, the curved surface is a convex surface.

Optionally, the end of each of the plurality of spacers distal to the base substrate has one or more grooves on the curved surface; and a thickness of the flexible transparent conductive layer in a region corresponding to the one or more grooves is greater than the thickness of the flexible transparent conductive layer in a region outside the one or more grooves.

Optionally, the one or more grooves have a cross-shape.

Optionally, the auxiliary cathode comprises a transparent conductive sub-layer electrically connected to the flexible transparent conductive layer.

Optionally, the organic light emitting diode display substrate has a subpixel region and an inter-subpixel region; and the transparent conductive sub-layer extends substantially throughout the subpixel region and the inter-subpixel region.

Optionally, the organic light emitting diode display substrate is a color filter substrate comprising a color filter; and a projection of the transparent conductive sub-layer on the base substrate substantially covers a projection of the color filter on the base substrate.

Optionally, the transparent conductive sub-layer is on a side of the spacer layer proximal to the base substrate.

Optionally, the transparent conductive sub-layer and the flexible transparent conductive layer are an integral layer.

Optionally, the auxiliary cathode further comprises a metallic conductive sub-layer on a side of the flexible transparent conductive layer proximal to the base substrate; and each of the plurality of spacers is between the metallic conductive sub-layer and the flexible transparent conductive layer.

Optionally, the organic light emitting diode display substrate has a subpixel region and an inter-subpixel region; and the metallic conductive sub-layer is substantially in the inter-subpixel region.

Optionally, the organic light emitting diode display substrate further comprises a black matrix layer on the base substrate; wherein the auxiliary cathode is on a side of the black matrix layer distal to the base substrate; and a projection of the black matrix layer on the base substrate substantially covers a projection of the metallic conductive sub-layer on the base substrate.

In another aspect, the present invention provides an organic light emitting diode display apparatus, comprising an array substrate having a plurality of organic light emitting diodes; and the organic light emitting diode display substrate described herein or fabricated by a method described herein facing the array substrate; wherein the array substrate comprises a cathode for the plurality of organic light emitting diodes; and the cathode is electrically connected to the flexible transparent conductive layer in the organic light emitting diode display substrate.

In another aspect, the present invention provides a method of fabricating an organic light emitting diode display substrate, comprising forming an auxiliary cathode on a base substrate; forming a spacer layer on the base substrate, the spacer layer being formed to comprise a plurality of spacers; and forming a flexible transparent conductive layer on a side of each of the plurality of spacers distal to the base substrate; wherein the flexible transparent conductive layer is formed to be electrically connected to the auxiliary cathode.

Optionally, forming the flexible transparent conductive layer comprises printing a flexible transparent conductive material on a side of each of the plurality of spacers distal to the base substrate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
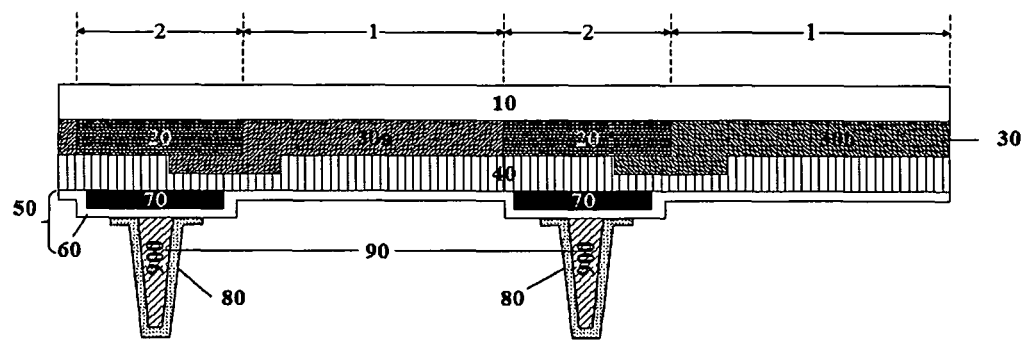
FIG. 1 is a schematic diagram illustrating the structure of an organic light emitting diode display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional organic light emitting diode display apparatus, especially a conventional top emission type organic light emitting diode display apparatus, the cathode for the organic light emitting diodes is typically made of a transparent conductive material such as indium zinc oxide or transparent metals such as magnesium:silver, to ensure light transmission of the light produced by the organic light emission layer. These transparent conductive materials typically have relatively high specific resistance, which presents a serious issue especially for a large size display panel. To lower the resistance of the cathode in the conventional organic light emitting diode display apparatus, sometimes an auxiliary cathode is used.

In some embodiments, an auxiliary cathode can be made on the counter substrate facing the array substrate of the organic light emitting diode display apparatus. In one example, the auxiliary cathode is made of a non-transparent metallic material, and can be made in the black matrix area. In doing so, the auxiliary cathode can be made to have a relatively low specific resistance, and at the same time does not affect light transmission in the display apparatus. The auxiliary cathode in the counter substrate is electrically connected to the cathode in the array substrate.

In some embodiments, the auxiliary cathode on the counter substrate is electrically connected to the cathode in the array substrate through a conductive layer disposed on a plurality of spacers between the counter substrate and the array substrate. It was discovered in the present disclosure that the conductive layer on the plurality of spacers is susceptible to physical damages caused by the compression force during or when the counter substrate and the array substrate are assembled together. One of the problems is that the conductive layer such as a transparent metal oxide layer is typically very brittle so that the conductive layer is prone to breaking, resulting in a loss of contact with the cathode in the array substrate and a poor electrical connection between the cathode and the auxiliary cathode.

Accordingly, the present disclosure provides, inter alia, an organic light emitting diode display substrate, an organic light emitting diode display apparatus, and a method of fabricating an organic light emitting diode display substrate that substantially obviate one or more of the problems due to limitations and disadvantages of the related art. In one aspect, the present invention provides an organic light emitting diode display substrate. In some embodiments, the organic light emitting diode display substrate includes a base substrate; an auxiliary cathode on the base substrate; a spacer layer on the base substrate and comprising a plurality of spacers; and a flexible transparent conductive layer on a side of each of the plurality of spacers distal to the base substrate. In the present organic light emitting diode display substrate, the flexible transparent conductive layer is electrically connected to the auxiliary cathode.

FIG. 1 is a schematic diagram illustrating the structure of an organic light emitting diode display substrate in some embodiments according to the present disclosure. Referring to FIG. 1, the organic light emitting diode display substrate in some embodiments includes a base substrate 10, an auxiliary cathode 50 on the base substrate 10, a spacer layer 90 on the base substrate 10, and a flexible transparent conductive layer 80 on a side of the spacer layer 90 distal to the base substrate 10. The spacer layer 90 in some embodiments includes a plurality of spacers 900. In some embodiments, the flexible transparent conductive layer 80 is on a side of each of the plurality of spacers 900 distal to the base substrate 10. The flexible transparent conductive layer 80 is electrically connected to the auxiliary cathode 50.

In the context of the present disclosure, the term "flexible" as used herein in conjunction with a conductive layer described herein refers to a conductive layer that is non-brittle at a normal usage temperature (e.g., room temperature) so that it can be deformed (e.g., compressed, bent, or stretched) without easily breaking. Optionally, the conductive layer is flexible if the conductive layer can be compressed or stretched more than 5% (e.g., more than 10%, more than 15%, more than 20%) without exceeding its elastic limit at a normal usage temperature (e.g., room temperature). The brittleness of the flexible transparent conductive layer 80 may be measured by, e.g., ASTM D256-97 impact test (Izod impact test).

In some embodiments, the flexible transparent conductive layer 80 includes a polymer material. Examples of suitable polymer materials for making the flexible transparent conductive layer 80 include a substantially transparent polymer material such as poly(ethylene terephthalate) (PET), polymethylmethacrylate (PMMA), polycarbonate (PC), and so on.

Optionally, the polymer material includes a conductive polymer such as poly(3,4-ethylenedioxythiophene) poly(styrenesulfonate) (PEDOT:PSS). Optionally, the flexible transparent conductive layer 80 include a polymer material as a matrix and one or more non-polymer conductive material dispersed in the polymer matrix. Examples of non-polymer conductive materials include a metal (e.g., nano-silver), graphene, carbon nanotubes, indium tin oxide, and so on. Optionally, the flexible transparent conductive layer 80 further include an adhesive, a glue, or a transparent resin for binding the non-polymer conductive materials.

Optionally, the flexible transparent conductive layer 80 has a light transmission rate (e.g., measured by ASTM D1003 test) greater than 80%, e.g., greater than 85%, greater than 90%, greater than 91%, greater than 92%, and greater than 95%. Optionally, the flexible transparent conductive layer 80 has sheet resistance (e.g., measured by ASTM F1711 test) less than 300Ω/□, e.g., less than 200Ω/□, less than 150Ω/□, less than 100Ω/□, less than 80Ω/□, less than 70Ω/□, less than 60Ω/□, less than 50Ω/□, less than 40 Ω/□, less than 30Ω/□, and less than 20Ω/□. Optionally, the flexible transparent conductive layer 80 has a flexibility characterized by a number of bending cycles greater than 10,000 (e.g., greater than 50,000, greater than 100,000, greater than 200,000, and greater than 300,000) at a bending radius of approximately 1 mm. Optionally, the flexible transparent conductive layer 80 has a have (e.g., measured by ASTM D1003 test) less than 10%, e.g., less than 5%, less than 2%, less than 1%, and less than 0.5%.

Figure 2:
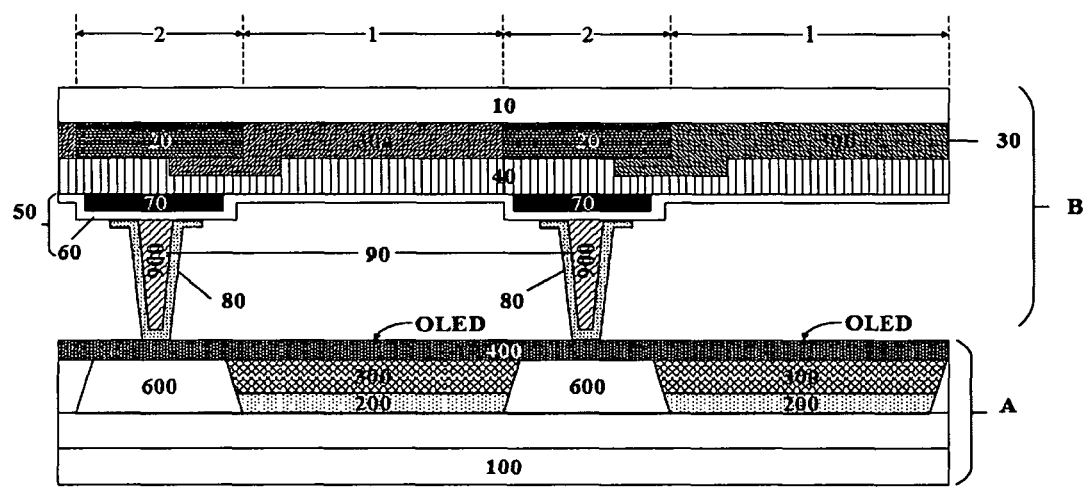
FIG. 2 is a schematic diagram illustrating the structure of an organic light emitting diode display apparatus in some embodiments according to the present disclosure.

FIG. 2 is a schematic diagram illustrating the structure of an organic light emitting diode display apparatus in some embodiments according to the present disclosure. Referring to FIG. 2, the organic light emitting diode display apparatus includes an organic light emitting diode display substrate B as depicted in FIG. 1, and an array substrate A facing the organic light emitting diode display substrate B (e.g., a counter substrate). In the organic light emitting diode display apparatus, the plurality of spacers 900 are configured to maintain a spacing between two substrates, e.g., between the present organic light emitting diode display substrate and an array substrate facing the present organic light emitting diode display substrate. The organic light emitting diode display apparatus has a subpixel region 1 and an inter-subpixel region 2. The array substrate A includes a plurality of organic light emitting diodes OLED. The plurality of organic light emitting diodes OLED are substantially in the subpixel region 1. Each of the plurality of organic light emitting diodes OLED includes an anode 200, an organic light emitting layer 300, and a cathode 400. In the present organic light emitting diode display apparatus, the cathode 400 in the array substrate A is electrically connected to the auxiliary cathode 50 in the organic light emitting diode display substrate B. Optionally, the array substrate A further includes a pixel definition layer 600, which is substantially in the inter-subpixel region 2. Optionally, the organic light emitting diode display apparatus is a top emission type organic light emitting diode display apparatus.

As used herein, a subpixel region refers to a light emission region of a subpixel, such as a region corresponding to a pixel electrode in a liquid crystal display or a region corresponding to a light emissive layer in an organic light emitting diode display panel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Referring to FIG. 2, the flexible transparent conductive layer 80 electrically connects the cathode 400 in the array substrate A and the auxiliary cathode 50 in the organic light emitting diode display substrate B. During the process of assembling the array substrate A and the organic light emitting diode display substrate B into the organic light emitting diode display apparatus, the plurality of spacers 900 are pressed against the cathode 400 in the array substrate A, ensuring that the flexible transparent conductive layer 80 on the surface of the plurality of spacers 900 is in contact with the cathode 400 in the array substrate A, thereby electrically connecting the cathode 400 in the array substrate A and the auxiliary cathode 50 in the organic light emitting diode display substrate B. Because the flexible transparent conductive layer 80 on the plurality of spacers 900 is flexible, not brittle, the flexible transparent conductive layer 80 does not easily break when the array substrate A and the organic light emitting diode display substrate B are assembled into the organic light emitting diode display apparatus. This ensures an excellent electrical connection between the cathode 400 in the array substrate A and the auxiliary cathode 50 in the organic light emitting diode display substrate B.

Referring to FIG. 1 and FIG. 2, in some embodiments, a projection of the flexible transparent conductive layer 80 on the base substrate 10 substantially covers projections of the plurality of spacers 900 on the base substrate 10. Optionally, the projection of the flexible transparent conductive layer 80 on the base substrate 10 at least partially overlaps with the projections of the plurality of spacers 900 on the base substrate 10. Various appropriate design may be implemented to make the flexible transparent conductive layer 80 so long as it electrically connects the cathode 400 in the array substrate A and the auxiliary cathode 50 in the organic light emitting diode display substrate B.

In some embodiments, and as depicted in FIG. 1 and FIG. 2, the auxiliary cathode 50 includes a transparent conductive sub-layer 60 electrically connected to the flexible transparent conductive layer 80. The transparent conductive sub-layer 60 in some embodiments is on a side of a black matrix layer 20 distal to the base substrate 10, the plurality of spacers 900 are on a side of the transparent conductive sub-layer 60 distal to the base substrate 10, and the flexible transparent conductive layer 80 is on a side of the plurality of spacers 900 distal to the transparent conductive sub-layer 60 and in contact with the transparent conductive sub-layer 60.

In some embodiments, and as depicted in FIG. 1 and FIG. 2, the organic light emitting diode display substrate B has a subpixel region 1 and an inter-subpixel region 2. Optionally, the transparent conductive sub-layer 60 extends substantially throughout the subpixel region 1 and the inter-subpixel region 2. In some embodiments, the transparent conductive sub-layer 60 is made of a metal oxide material. Examples of metal oxides for making the transparent conductive sub-layer 60 include, but are not limited to, indium tin oxide, indium zinc oxide, and so on.

Because the transparent conductive sub-layer 60 is made of a transparent material, it may be disposed in a region not limited to that corresponding to the black matrix layer 20. In one example, the transparent conductive sub-layer 60 may be disposed in both the subpixel region 1 and the inter-subpixel region 2. Optionally, the transparent conductive sub-layer 60 may be formed as a layer substantially throughout the counter substrate, e.g., without patterning. By having a large area transparent conductive sub-layer 60, the resistance of the auxiliary cathode 50 can be further decreased.

In some embodiments, the organic light emitting diode display substrate B further includes an overcoat layer 40 on the base substrate 10 to planarize the surface of the display substrate. Optionally, the auxiliary cathode 50 is on a side of the overcoat layer 40 distal to the base substrate 10. For example, the transparent conductive sub-layer 60 is on a side of the overcoat layer 40 distal to the base substrate 10. Optionally, the transparent conductive sub-layer 60 is on a side of the spacer layer 90 proximal to the base substrate 10.

In some embodiments, the organic light emitting diode display substrate B further includes a color filter 30. The color filter 30 may include a plurality of color filter blocks (e.g., the color filter blocks 30a and 30b in FIG. 1 and FIG. 2). Optionally, the color filter 30 is at least partially in the subpixel region 1. Optionally, a projection of the transparent conductive sub-layer 60 on the base substrate 10 substantially covers a projection of the color filter 30 on the base substrate 10.

In some embodiments, the auxiliary cathode 50 further includes a metallic conductive sub-layer 70 on a side of the flexible transparent conductive layer 80 proximal to the base substrate 10. Referring to FIG. 1 and FIG. 2, the organic light emitting diode display substrate B in some embodiments includes an overcoat layer 40, a metallic conductive sub-layer 70 on a side of the overcoat layer 40 distal to the base substrate 10, a transparent conductive sub-layer 60 on a side of the metallic conductive sub-layer 70 distal to the overcoat layer 40, a spacer layer 90 having a plurality of spacers 900 on a side of the transparent conductive sub-layer 60 distal to the metallic conductive sub-layer 70, and a flexible transparent conductive layer 80 on a side of the spacer layer 90 distal to the transparent conductive sub-layer 60 and in contact with the transparent conductive sub-layer 60. Each of the plurality of spacers 900 is between the metallic conductive sub-layer 70 and the flexible transparent conductive layer 80.

In some embodiments, the metallic conductive sub-layer 70 is substantially in the inter-subpixel region 2. Optionally, the metallic conductive sub-layer 70 is made of a metal or an alloy. Examples of metals or alloys suitable for making the metallic conductive sub-layer 70 include, but are not limited to, copper, aluminum, silver, gold, titanium, tungsten, nickel, and so on.

In some embodiments, and referring to FIG. 1 and FIG. 2, the organic light emitting diode display substrate B further includes a black matrix layer 20 on the base substrate 10. Optionally, the black matrix layer 20 is in the inter-subpixel region 2 and defines the subpixel region 1. Optionally, the auxiliary cathode 50 is on a side of the black matrix layer 20 distal to the base substrate 10. For example, the metallic conductive sub-layer 70 is on a side of the black matrix layer 20 distal to the base substrate 10, and the transparent conductive sub-layer 60 is on a side of the metallic conductive sub-layer 70 distal to the black matrix layer 20. Optionally, a projection of the black matrix layer 20 on the base substrate 10 substantially covers a projection of the metallic conductive sub-layer 70 on the base substrate 10. Optionally, the projection of the black matrix layer 20 on the base substrate 10 substantially overlaps with the projection of the metallic conductive sub-layer 70 on the base substrate 10.

Figure 3:
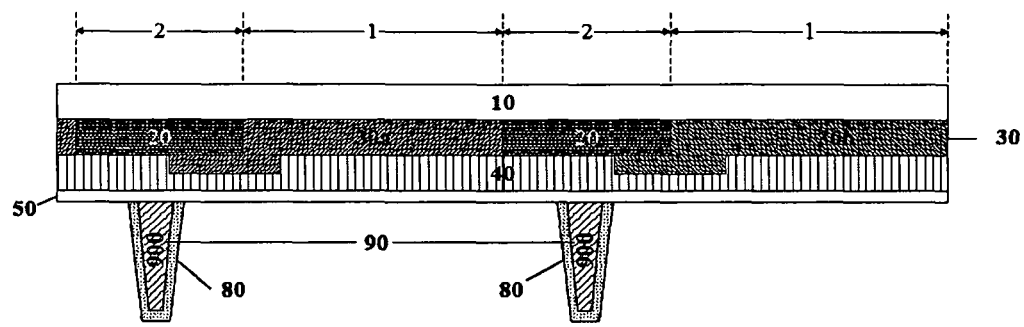
FIG. 3 is a schematic diagram illustrating the structure of an organic light emitting diode display substrate in some embodiments according to the present disclosure.
Figure 4:
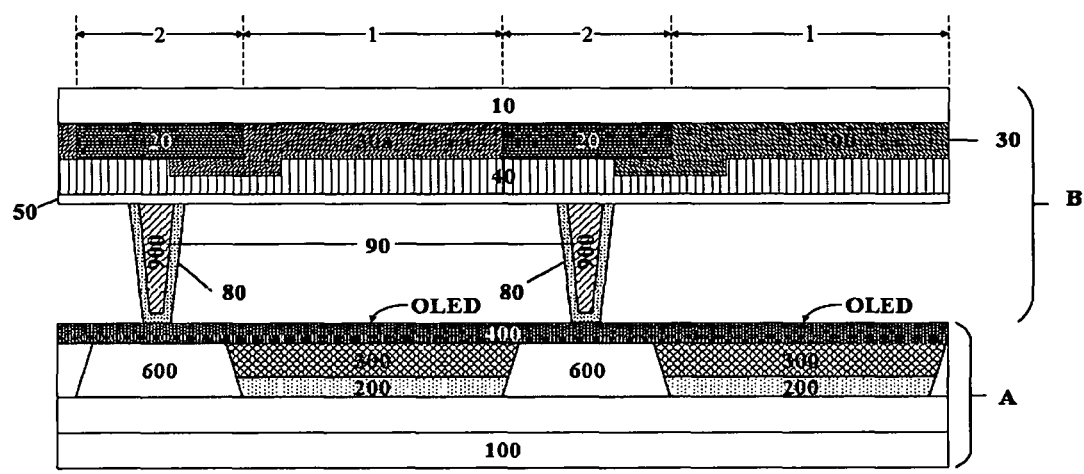
FIG. 4 is a schematic diagram illustrating the structure of an organic light emitting diode display apparatus in some embodiments according to the present disclosure.

FIG. 3 is a schematic diagram illustrating the structure of an organic light emitting diode display substrate in some embodiments according to the present disclosure. FIG. 4 is a schematic diagram illustrating the structure of an organic light emitting diode display apparatus in some embodiments according to the present disclosure. Referring to FIG. 3 and FIG. 4, the auxiliary cathode 50 does not include a metallic conductive sub-layer but only a transparent conductive sub-layer. The spacer layer 90 having the plurality of spacers 900 is on the auxiliary cathode 50, and the flexible transparent conductive layer 80 is on a side of the plurality of spacers 900 distal to the auxiliary cathode 50 and is in contact with the auxiliary cathode 50. In a process of forming the organic light emitting diode display substrate B, a transparent conductive material is deposited on the overcoat layer 40 to form the auxiliary cathode 50, a spacer layer 90 is formed on the auxiliary cathode 50, and a flexible transparent conductive layer 80 is coated on the plurality of spacers 900.

Figure 5:
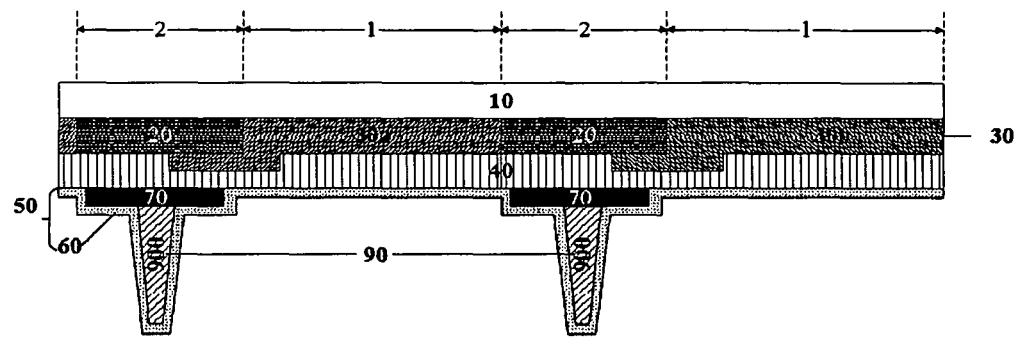
FIG. 5 is a schematic diagram illustrating the structure of an organic light emitting diode display substrate in some embodiments according to the present disclosure.
Figure 6:
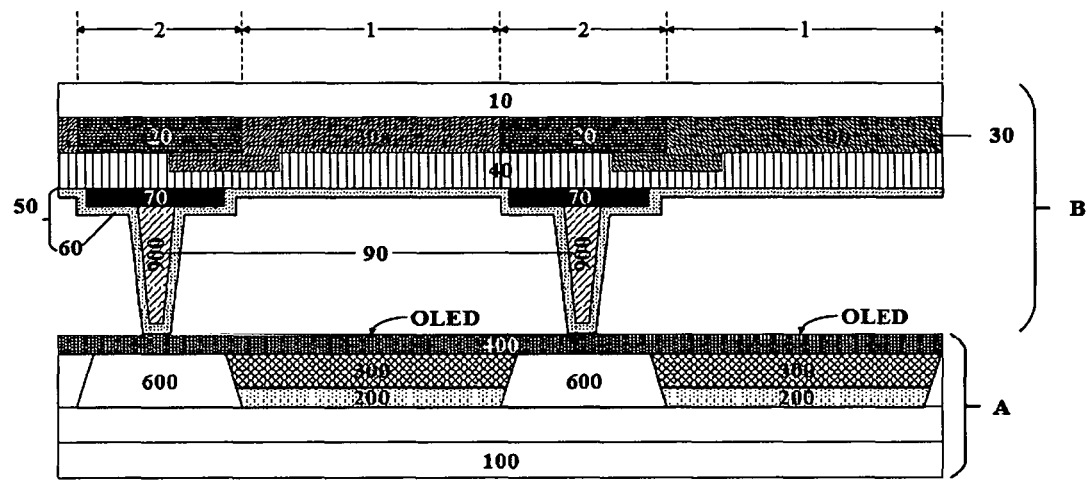
FIG. 6 is a schematic diagram illustrating the structure of an organic light emitting diode display apparatus in some embodiments according to the present disclosure.

FIG. 5 is a schematic diagram illustrating the structure of an organic light emitting diode display substrate in some embodiments according to the present disclosure. FIG. 6 is a schematic diagram illustrating the structure of an organic light emitting diode display apparatus in some embodiments according to the present disclosure. Referring to FIG. 5 and FIG. 6, the transparent conductive sub-layer 60 and the flexible transparent conductive layer are an integral layer. For example, the transparent conductive sub-layer 60 and the flexible transparent conductive layer are not separately fabricated, but formed in a single process using a same material in a same layer. In one example, the entire transparent conductive sub-layer 60 is made of a flexible transparent conductive material.

As used herein, the term "same layer" refers to the relationship between the layers simultaneously formed in the same step. In one example, the transparent conductive sub-layer 60 and the flexible transparent conductive layer are in a same layer when they are formed as a result of one or more steps of a same patterning process performed in a same layer of material. In another example, the transparent conductive sub-layer 60 and the flexible transparent conductive layer can be formed in a same layer by simultaneously performing the step of forming the transparent conductive sub-layer 60 and the step of forming the flexible transparent conductive layer. The term "same layer" does not always mean that the thickness of the layer or the height of the layer in a cross-sectional view is the same.

Specifically, and referring to FIG. 5 and FIG. 6, the auxiliary cathode 50 includes a metallic conductive sub-layer 70 and a transparent conductive sub-layer 60 made of a flexible transparent conductive material. The metallic conductive sub-layer 70 is on the overcoat layer 40, the spacer layer 90 having the plurality of spacers 900 is on a side of the metallic conductive sub-layer 70 distal to the overcoat layer 40, and the transparent conductive sub-layer 60 is on a side of the spacer layer 90 distal to the metallic conductive sub-layer 70. Each of the plurality of spacers 900 is between the metallic conductive sub-layer 70 and the transparent conductive layer 60. In a process of forming the organic light emitting diode display substrate B, the metallic conductive sub-layer 70 is formed on the overcoat layer 40, the plurality of spacers 900 are formed on the metallic conductive sub-layer 70, a flexible transparent conductive material is coated over substantially the entire display substrate to form the transparent conductive sub-layer 60.

Figure 7:
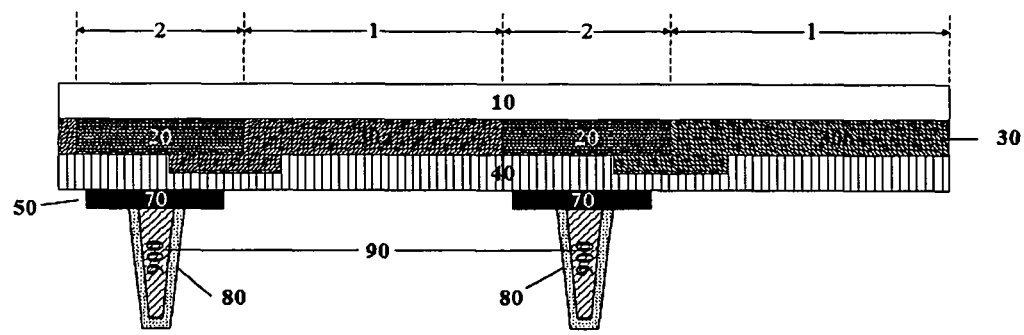
FIG. 7 is a schematic diagram illustrating the structure of an organic light emitting diode display substrate in some embodiments according to the present disclosure.
Figure 8:
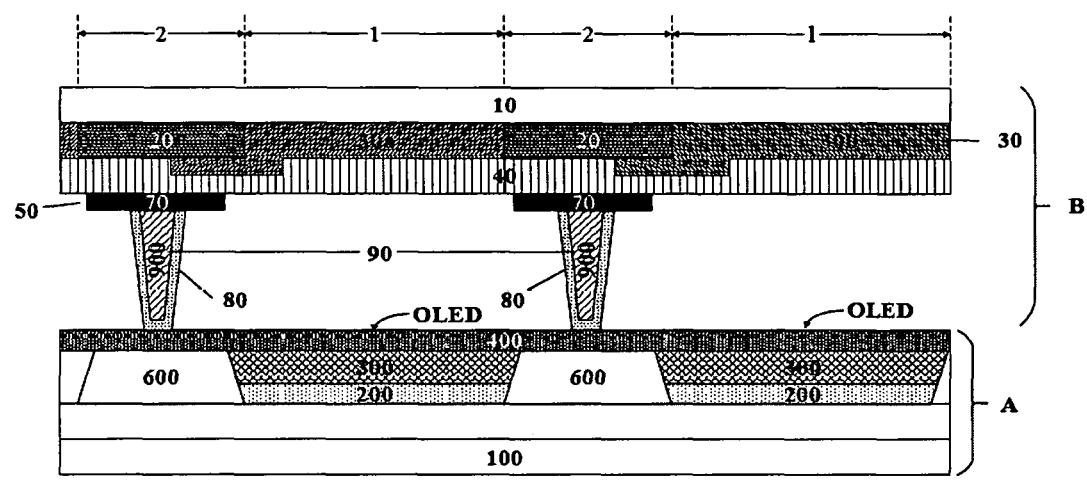
FIG. 8 is a schematic diagram illustrating the structure of an organic light emitting diode display apparatus in some embodiments according to the present disclosure.

FIG. 7 is a schematic diagram illustrating the structure of an organic light emitting diode display substrate in some embodiments according to the present disclosure. FIG. 8 is a schematic diagram illustrating the structure of an organic light emitting diode display apparatus in some embodiments according to the present disclosure. Referring to FIG. 7 and FIG. 8, the auxiliary cathode 50 does not include a transparent conductive sub-layer but only a metallic conductive sub-layer. The spacer layer 90 having the plurality of spacers 900 is on the metallic conductive sub-layer 70, and the flexible transparent conductive layer 80 is on a side of the plurality of spacers 900 distal to the metallic conductive sub-layer 70 and is in contact with the metallic conductive sub-layer 70. In a process of forming the organic light emitting diode display substrate B, a metallic conductive sub-layer 70 is formed on the overcoat layer 40, a spacer layer 90 is formed on the metallic conductive sub-layer 70, and a flexible transparent conductive layer 80 is coated on the plurality of spacers 900.

Figure 9:
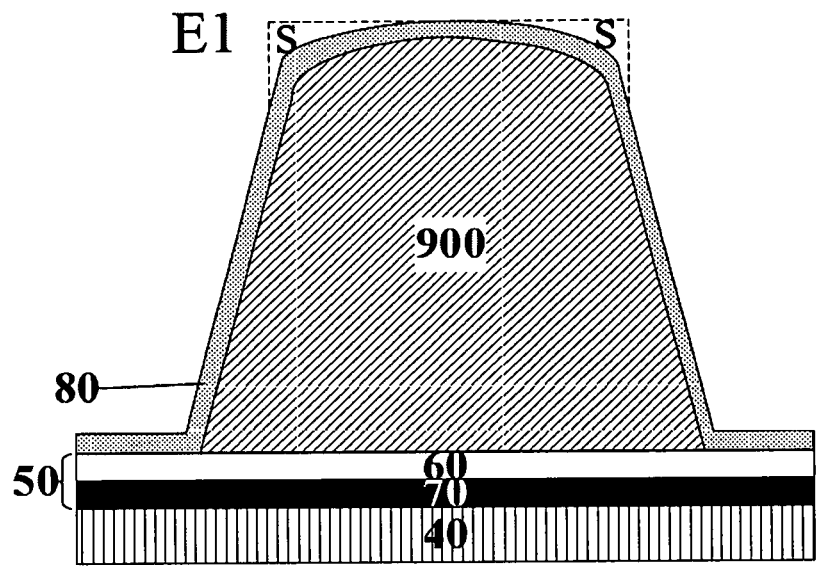
FIG. 9 is a cross-sectional view of a spacer in an organic light emitting diode display substrate in some embodiments according to the present disclosure.
Figure 10:
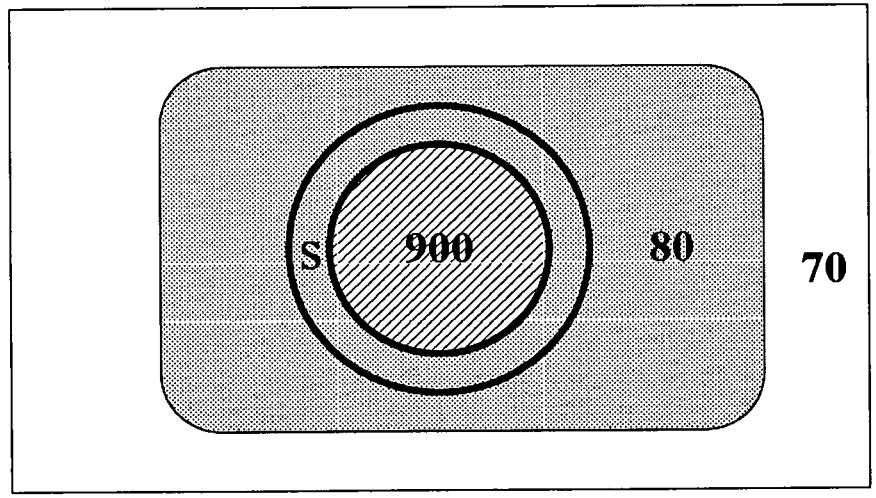
FIG. 10 is a top view of a spacer in an organic light emitting diode display substrate in some embodiments according to the present disclosure.

Because the flexible transparent conductive layer 80 coated on the plurality of spacers 900 is made of a flexible, compress-sable material, the plurality of spacers 900 can be designed to enhance the contact between the flexible transparent conductive layer 80 and the cathode 400 in the array substrate A and thus the electrically connection between the auxiliary cathode 50 and the cathode 400. For example, the plurality of spacers 900 can be made to have a shape that achieves this purpose. FIG. 9 is a cross-sectional view of a spacer in an organic light emitting diode display substrate in some embodiments according to the present disclosure. FIG. 10 is a top view of a spacer in an organic light emitting diode display substrate in some embodiments according to the present disclosure. Referring to FIG. 9 and FIG. 10, each of the plurality of spacers 900 protrudes away from the overcoat layer 40 (thus away from the base substrate 10 in FIG. 1 and FIG. 2). Each of the plurality of spacers 900 has an end E1 distal to the overcoat layer 40 (e.g., distal to the base substrate 10 in FIG. 1 and FIG. 2). As depicted in FIG. 9, the end E1 has a curved surface. Optionally, the curved surface is a convex surface such as a surface having a partial spherical shape. By having a curved end E1, the flexible transparent conductive layer 80 on the end E1 can be squeezed into a space S in peripheral region of the end E1. In this way, the compression force applied on the flexible transparent conductive layer 80 during and when the organic light emitting diode display apparatus are assembled can be partially alleviated, preventing the flexible transparent conductive layer 80 from breaking. FIG. 10 illustrates a top view of a spacer when the plurality of spacers 900 are pressed against the array substrate. The flexible transparent conductive material squeezed into the space S electrically connects the auxiliary cathode 50 and the cathode 400.

Figure 11:
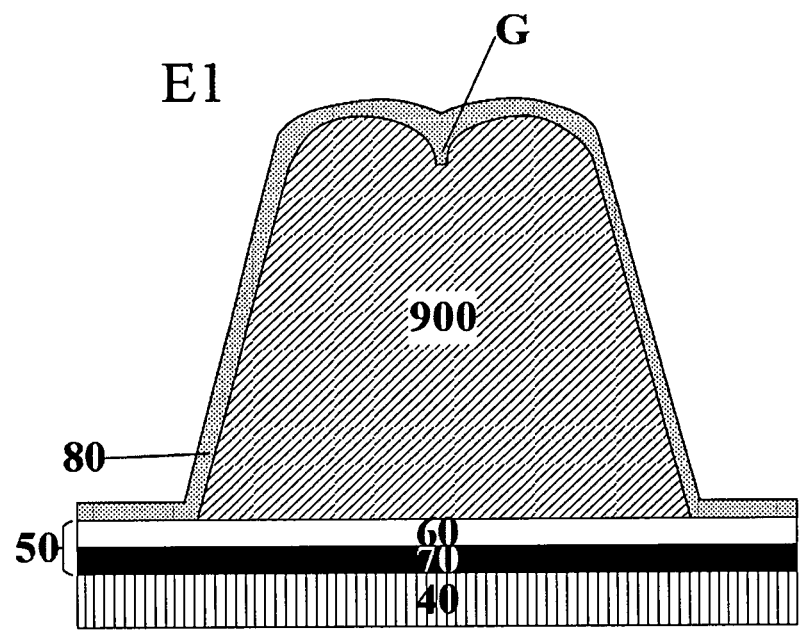
FIG. 11 is a cross-sectional view of a spacer in an organic light emitting diode display substrate in some embodiments according to the present disclosure.
Figure 12:
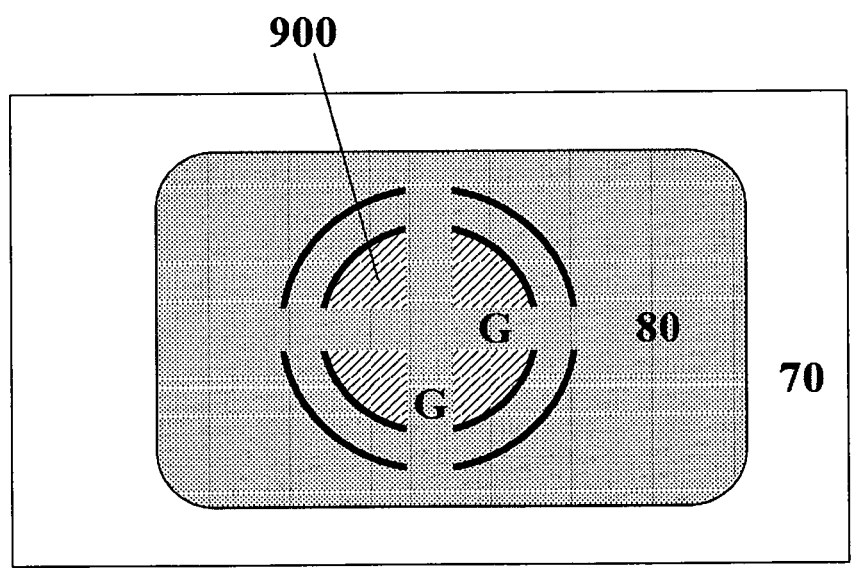
FIG. 12 is a top view of a spacer in an organic light emitting diode display substrate in some embodiments according to the present disclosure.

FIG. 11 is a cross-sectional view of a spacer in an organic light emitting diode display substrate in some embodiments according to the present disclosure. FIG. 12 is a top view of a spacer in an organic light emitting diode display substrate in some embodiments according to the present disclosure. Referring to FIG. 11 and FIG. 12, in some embodiments, the end E1 of each of the plurality of spacers 900 distal to the overcoat layer 40 has one or more grooves G on the surface of the end E1. In FIG. 11, a curved surface is shown. Optionally, the end E1 may be a substantially flat surface and have one or more grooves G. As depicted in FIG. 11, a thickness of the flexible transparent conductive layer 80 in a region corresponding to the one or more grooves G is greater than the thickness of the flexible transparent conductive layer 80 in a region outside the one or more grooves G. As depicted in FIG. 12, during and when the organic light emitting diode display apparatus are assembled, a certain amount of the flexible transparent conductive material of the flexible transparent conductive layer 80 is retained in the one or more grooves G, effectively enhancing the electrically connection between the auxiliary cathode 50 and the cathode 400.

Optionally, the one or more grooves have a cross-shape (e.g., a X shape) as shown in FIG. 12. Optionally, the one or more grooves includes a single groove. Optionally, the one or more grooves have a star shape (e.g., a * shape).

In another aspect, the present disclosure provides a method of fabricating an organic light emitting diode display substrate. In some embodiments, the method includes forming an auxiliary cathode on the base substrate; forming a spacer layer on the base substrate, the spacer layer being formed to include a plurality of spacers; and forming a flexible transparent conductive layer on a side of each of the plurality of spacers distal to the base substrate. The flexible transparent conductive layer is formed to be electrically connected to the auxiliary cathode. Optionally, the step of forming the flexible transparent conductive layer includes printing or coating a flexible transparent conductive material on a side of each of the plurality of spacers distal to the base substrate. Optionally, the flexible transparent conductive layer is formed so that a projection of the flexible transparent conductive layer on the base substrate substantially covers projections of the plurality of spacers on the base substrate. Optionally, the spacer layer is formed so that each of the plurality of spacers protrudes away from the base substrate. An end of each of the plurality of spacers distal to the base substrate is formed to have a curved surface, e.g., a convex surface. Optionally, the spacer layer is formed so that the end of each of the plurality of spacers distal to the base substrate has one or more grooves on the curved surface. A thickness of the flexible transparent conductive layer in a region corresponding to the one or more grooves is greater than the thickness of the flexible transparent conductive layer in a region outside the one or more grooves.

In some embodiments, the step of forming the auxiliary cathode includes forming a transparent conductive sub-layer electrically connected to the flexible transparent conductive layer. Optionally, the organic light emitting diode display substrate has a subpixel region and an inter-subpixel region; and the transparent conductive sub-layer is formed to extend substantially throughout the subpixel region and the inter-subpixel region. Optionally, the method further includes forming a color filter, and the transparent conductive sub-layer is formed so that a projection of the transparent conductive sub-layer on the base substrate substantially covers a projection of the color filter on the base substrate. Optionally, the transparent conductive sub-layer is formed on a side of the spacer layer proximal to the base substrate. Optionally, the transparent conductive sub-layer and the flexible transparent conductive layer are formed as an integral layer.

In some embodiments, the step of forming the auxiliary cathode includes forming a metallic conductive sub-layer on a side of the flexible transparent conductive layer proximal to the base substrate. Optionally, each of the plurality of spacers is formed between the metallic conductive sub-layer and the flexible transparent conductive layer. Optionally, the organic light emitting diode display substrate is formed to have a subpixel region and an inter-subpixel region; and the metallic conductive sub-layer is formed to be substantially in the inter-subpixel region. Optionally, the method further includes forming a black matrix layer on the base substrate. Optionally, the auxiliary cathode is formed on a side of the black matrix layer distal to the base substrate. Optionally, the metallic conductive sub-layer is formed so that a projection of the black matrix layer on the base substrate substantially covers a projection of the metallic conductive sub-layer on the base substrate.

Figure 13A:
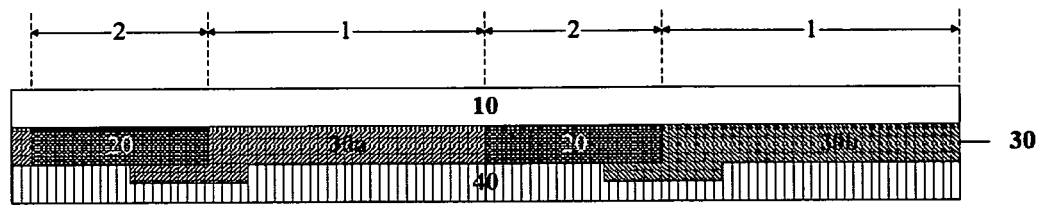
FIGS. 13A to 13E illustrate a process of fabricating an organic light emitting diode display substrate in some embodiments according to the present disclosure.
Figure 13B:
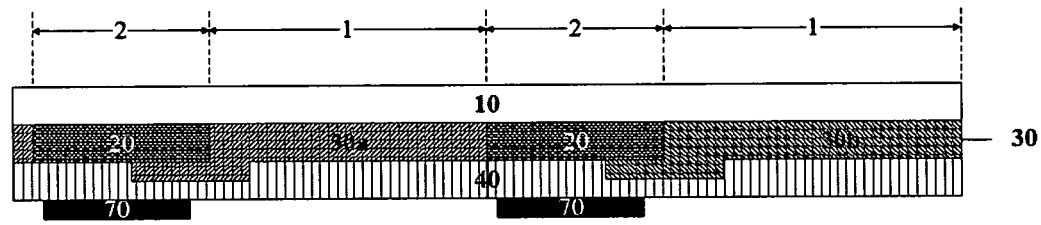
Figure 13C:
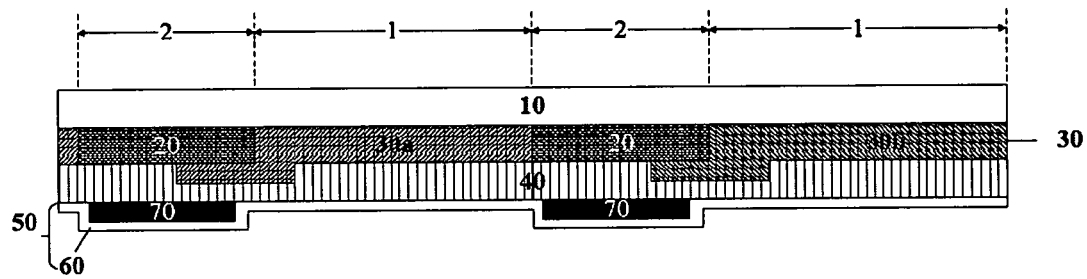
Figure 13D:
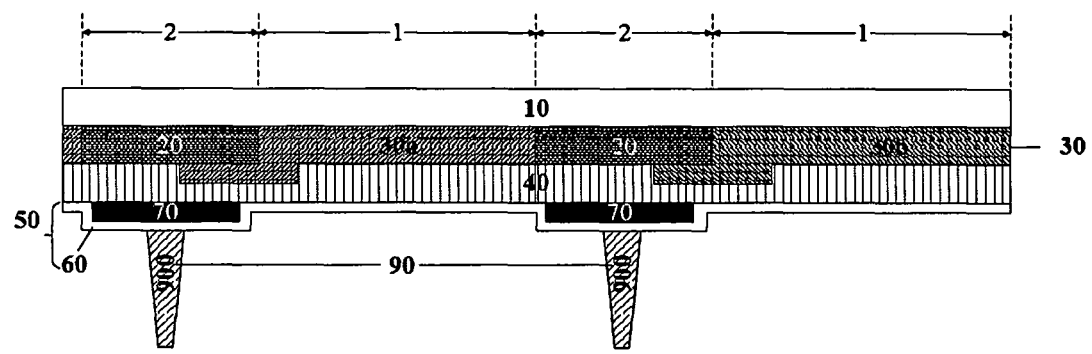
Figure 13E:
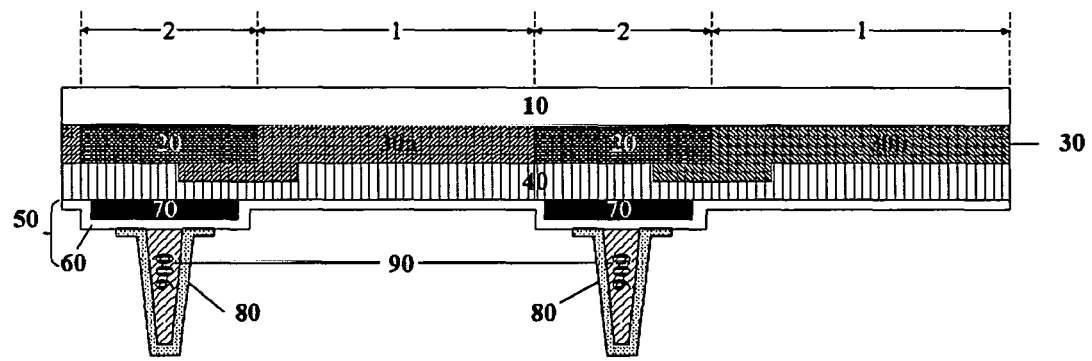

FIGS. 13A to 13E illustrate a process of fabricating an organic light emitting diode display substrate in some embodiments according to the present disclosure. Referring to FIG. 13A, a black matrix layer 20 is formed on the base substrate 10 in the inter-subpixel region 2, a color filter 30 having a plurality of color filter blocks (e.g., color filter blocks 30a and 30b) is formed on the base substrate 10 and substantially in the subpixel region 1. An overcoat layer 40 is formed on a side of the black matrix layer 20 and the color filter 30 distal to the base substrate 10, to planarize the surface of the display substrate. Referring to FIG. 13B, a metallic conductive sub-layer 70 is formed on a side of the overcoat layer 40 distal to the black matrix layer 20. The metallic conductive sub-layer 70 is formed substantially in the inter-subpixel region 2, a projection of the black matrix layer 20 on the base substrate 10 substantially covers a projection of the metallic conductive sub-layer 70 on the base substrate 10. Referring to FIG. 13C, a transparent conductive sub-layer 60 is formed on a side of the metallic conductive sub-layer 70 distal to the overcoat layer 40. The transparent conductive sub-layer 60 is formed substantially throughout the subpixel region 1 and the inter-subpixel region 2. Referring to FIG. 13 D, a spacer layer 90 is formed on a side of the transparent conductive sub-layer 60 distal to the metallic conductive sub-layer 70. The spacer layer 90 is formed to include a plurality of spacers 900. Each of the plurality of spacers 900 is formed in the inter-subpixel region 2. A projection of the black matrix layer 20 on the base substrate 10 substantially covers projections of the plurality of spacers 900 on the base substrate 10. The plurality of spacers 900 are formed to protrudes away from the base substrate 10. An end of each of the plurality of spacers distal to the base substrate may be formed to have a particular shape, e.g., a curved surface containing one or more grooves. The plurality of spacers 900 having the particular shape may be patterned using a half-tone or a gray-tone mask plate. Referring to FIG. 13E, a flexible transparent conductive layer 80 is formed (e.g., coated or printed) on each of the plurality of spacers 900. The flexible transparent conductive layer 80 is formed to be electrically connected to the auxiliary cathode 50 (e.g., the transparent conductive sub-layer 60). As shown in FIG. 13E, the flexible transparent conductive layer 80 is formed to be in contact with the transparent conductive sub-layer 60.

In another aspect, the present disclosure provides an organic light emitting diode display apparatus having the organic light emitting diode display substrate described herein or fabricated by a method described herein. Optionally, the organic light emitting diode display apparatus is a top emission type organic light emitting diode display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode display substrate, comprising:
    a base substrate;
    an auxiliary cathode on the base substrate;
    a spacer layer on the base substrate and comprising a plurality of spacers; and
    a flexible transparent conductive layer on a side of each of the plurality of spacers distal to the base substrate;
    wherein the flexible transparent conductive layer is electrically connected to the auxiliary cathode;
    each of the plurality of spacers protrudes away from the base substrate;
    an end of each of the plurality of spacers distal to the base substrate has a curved surface;
    the end of each of the plurality of spacers distal to the base substrate has one or more grooves on the curved surface; and
    a thickness of the flexible transparent conductive layer in a region corresponding to the one or more grooves is greater than the thickness of the flexible transparent conductive layer in a region outside the one or more grooves.

2. The organic light emitting diode display substrate of claim 1, wherein the flexible transparent conductive layer comprises a polymer material.

3. The organic light emitting diode display substrate of claim 2, wherein the polymer material comprises a conductive polymer.

4. The organic light emitting diode display substrate of claim 2, wherein the flexible transparent conductive layer further comprises a metal.

5. The organic light emitting diode display substrate of claim 1, wherein a projection of the flexible transparent conductive layer on the base substrate substantially covers projections of the plurality of spacers on the base substrate.

6. The organic light emitting diode display substrate of claim 1, wherein the curved surface is a convex surface.

7. The organic light emitting diode display substrate of claim 1, wherein the one or more grooves have a cross-shape.

8. An organic light emitting diode display substrate, comprising:
a base substrate;
an auxiliary cathode on the base substrate;
a spacer layer on the base substrate and comprising a plurality of spacers; and
a flexible transparent conductive layer on a side of each of the plurality of spacers distal to the base substrate;
wherein the flexible transparent conductive layer is electrically connected to the auxiliary cathode; and
the auxiliary cathode comprises a transparent conductive sub-layer electrically connected to the flexible transparent conductive layer.

9. The organic light emitting diode display substrate of claim 8, wherein the organic light emitting diode display substrate has a subpixel region and an inter-subpixel region; and
the transparent conductive sub-layer extends substantially throughout the subpixel region and the inter-subpixel region.

10. The organic light emitting diode display substrate of claim 8, wherein the organic light emitting diode display substrate is a color filter substrate comprising a color filter; and
a projection of the transparent conductive sub-layer on the base substrate substantially covers a projection of the color filter on the base substrate.

11. The organic light emitting diode display substrate of claim 8, wherein the transparent conductive sub-layer is on a side of the spacer layer proximal to the base substrate.

12. The organic light emitting diode display substrate of claim 8, wherein the transparent conductive sub-layer and the flexible transparent conductive layer are an integral layer.

13. An organic light emitting diode display substrate, comprising:
a base substrate;
an auxiliary cathode on the base substrate;
a spacer layer on the base substrate and comprising a plurality of spacers; and
a flexible transparent conductive layer on a side of each of the plurality of spacers distal to the base substrate;
wherein the flexible transparent conductive layer is electrically connected to the auxiliary cathode;
the auxiliary cathode further comprises a metallic conductive sub-layer on a side of the flexible transparent conductive layer proximal to the base substrate; and
each of the plurality of spacers is between the metallic conductive sub-layer and the flexible transparent conductive layer.

14. The organic light emitting diode display substrate of claim 13, wherein the organic light emitting diode display substrate has a subpixel region and an inter-subpixel region; and
the metallic conductive sub-layer is substantially in the inter-subpixel region.

15. The organic light emitting diode display substrate of claim 13, further comprising a black matrix layer on the base substrate;
wherein the auxiliary cathode is on a side of the black matrix layer distal to the base substrate; and
a projection of the black matrix layer on the base substrate substantially covers a projection of the metallic conductive sub-layer on the base substrate.

16. An organic light emitting diode display apparatus, comprising an array substrate having a plurality of organic light emitting diodes; and
the organic light emitting diode display substrate of claim 1 facing the array substrate;
wherein the array substrate comprises a cathode for the plurality of organic light emitting diodes; and
the cathode is electrically connected to the flexible transparent conductive layer in the organic light emitting diode display substrate.

17. A method of fabricating the organic light emitting diode display substrate of claim 1, comprising:
forming an auxiliary cathode on a base substrate;
forming a spacer layer on the base substrate, the spacer layer being formed to comprise a plurality of spacers; and
forming a flexible transparent conductive layer on a side of each of the plurality of spacers distal to the base substrate;
wherein the flexible transparent conductive layer is formed to be electrically connected to the auxiliary cathode.

18. The method of claim 17, wherein forming the flexible transparent conductive layer comprises printing a flexible transparent conductive material on a side of each of the plurality of spacers distal to the base substrate.

* * * * *